United States Patent [19]

Schwalm et al.

[11] Patent Number: 5,069,998
[45] Date of Patent: * Dec. 3, 1991

[54] RADIATION SENSITIVE MIXTURE AND PRODUCTION OF RELIEF PATTERNS

[75] Inventors: Reinhold Schwalm, Wachenheim; Andreas Boettcher, Nussloch; Martin Fischer, Ludwigshafen; Horst Binder, Lampertheim, all of Fed. Rep. of Germany

[73] Assignee: BASF Aktiengesellschaft, Ludwigshafen, Fed. Rep. of Germany

[ * ] Notice: The portion of the term of this patent subsequent to Nov. 28, 2006 has been disclaimed.

[21] Appl. No.: 352,419

[22] Filed: May 16, 1989

[30] Foreign Application Priority Data

May 19, 1988 [DE] Fed. Rep. of Germany ....... 3817010

[51] Int. Cl.$^5$ .............................................. G03F 7/039
[52] U.S. Cl. ..................... 430/270; 430/921; 430/910; 522/31
[58] Field of Search ................... 522/31; 430/270, 921

[56] References Cited

U.S. PATENT DOCUMENTS

| | | | |
|---|---|---|---|
| 4,491,628 | 1/1985 | Ito et al. | 430/176 |
| 4,506,006 | 3/1985 | Ruckert | 430/270 X |
| 4,678,737 | 7/1987 | Schneller et al. | 430/270 |
| 4,689,288 | 8/1987 | Buiguez et al. | 430/270 |
| 4,770,977 | 9/1988 | Buiguez et al. | 430/323 |
| 4,820,607 | 4/1989 | Aoai | 430/190 |
| 4,883,740 | 11/1989 | Schwalm et al. | 522/31 X |

FOREIGN PATENT DOCUMENTS

| | | |
|---|---|---|
| 0146411 | 6/1979 | European Pat. Off. . |
| 0249139 | 3/1989 | European Pat. Off. . |
| 3721741 | 2/1980 | Fed. Rep. of Germany . |
| 3638046 | 2/1987 | Fed. Rep. of Germany . |
| 62-38450 | 2/1987 | Japan ................................. 430/270 |

OTHER PUBLICATIONS

Research Disclosure, No. 273, Jan. 1987, p. 24.
Microelectronic Engineering, vol. 6, Nos. 1-4, Dec. 1987, pp. 503-506.
Journal of Imaging Technology, vol. 11, No. 4, Aug. 1985, pp. 146-157.
Applications of Photoinitiated Cationic Polymerization Toward the Development of New Photoresists-Crivello-Appl. Polym. Sci., 48, pp. 65-69 (1985).
Photoinitiated Cationic Polymerization by Dialkyl-4-Hydroxyphenylsulfonium Salts-Crivello et al.-J. Polymer Science; vol. 18, 1021-1034 (1980).

Primary Examiner—Cynthia Hamilton
Attorney, Agent, or Firm—Keil & Weinkauf

[57] ABSTRACT

A radiation sensitive mixture useful for producing relief patterns contains
(a) a polymeric binder which is insoluble in water but soluble in aqueous alkaline solutions and
(b) an organic compound whose solubility in an aqueous alkaline developer is increased by the action of acid and which contains at least one acid cleavable group and additionally a group which forms a strong acid on irradiation, and in addition
(c) a nonphotosensitive organic compound which contains at least one acid cleavable bond and the solubility of which in an aqueous alkaline developer is increased by the action of acid, or
(d) a nonphotosensitive organic compound which contains at least one acid cleavable bond and which by the action of acid decomposes in such a way as to be completely removable by treatment at from 60° to 120° C.

8 Claims, No Drawings

RADIATION SENSITIVE MIXTURE AND PRODUCTION OF RELIEF PATTERNS

The present invention relates to positive working radiation sensitive mixtures which contain a binder which is soluble in aqueous alkali, a compound which contains at least one acid cleavable bond and on irradiation forms a strong acid, the solubility of the compound in an alkaline solvent being increased by the action of the acid, and further non-radiation sensitive compounds containing acid cleavable bonds. These mixtures are sensitive to UV, electron beams and X-rays and are suitable in particular for use as resist materials.

Positive working radiation sensitive mixtures are known. In commerce, use is made in particular of positive working resist materials which contain o-quinonediazides in binders which are soluble in aqueous alkali, for example novolaks or poly(p-vinylphenol)s. However, the sensitivity of these systems to radiation, in particular shortwave radiation, is not always satisfactory.

Sensitivity increases in radiation sensitive systems which in the primary photoreaction produce a species which then, independently of the radiation, initiates a catalytic secondary reaction are known for example from U.S. Pat. No. 3,915,706, which describes photoinitiators which produce a strong acid which in a secondary reaction then cleaves acid labile groups, such as polyaldehyde groups.

Radiation sensitive mixtures of polymers having acid labile side groups and photochemical acid donors are known for example from U.S. Pat. No. 4,491,628 and FR-A-2,570,844. However, these polymeric binders are hydrophobic and only become alkali soluble on irradiation.

The use of onium salts as photochemical acid donors in resist materials is known for example from said U.S. Pat. No. 4,491,628. A review of the use in resist materials is given by Crivello in Org. Coatings and Appl. Polym. Sci. 48 (1985), 65–69.

The prior art (DE-A-3,406,927) also discloses radiation sensitive mixtures based on acid cleavable compounds which contain as the binder a polymer which is soluble in aqueous alkali, a compound which photochemically forms a strong acid, and a further compound containing acid cleavable bonds, which by the action of the acid increase the solubility thereof in an alkaline developer. Compounds mentioned as photochemically forming strong acids are diazonium, phosphonium, sulfonium and iodonium compounds and also halogen compounds. The disadvantage of these photoinitiators is that aside from the acids formed irradiation does not give rise to any photoproducts which increase the solubility in the alkaline developer.

DE-A-3,721,741 proposes radiation sensitive mixtures which contain a polymeric binder which is soluble in aqueous alkaline solutions and an organic compound whose solubility in an aqueous alkaline developer is increased by the action of acid, which contains at least one acid cleavable group and which on irradiation forms a strong acid. However, these systems have disadvantages for certain applications. For instance, in these systems the organic compound has two functions, namely to reduce the solubility of the polymeric binder prior to irradiation and to raise it after irradiation and, secondly, the compound must be radiation sensitive. However, for certain applications it is advantageous to reduce the proportion of photoactive organic compound, for example in order to obtain a higher transparency in the shortwave UV field (in the region of 250 nm), so that solubility inhibition must be achieved in some other way.

EP-A-0,249,139 describes resist compositions which contain an organic polymer which is soluble in water or in aqueous bases, a compound which contains an acid labile group and which is a solubility inhibitor for the water-soluble polymer, for example a tert-butyl ester compound, and an arylonium salt, for example an arylsulfonium or aryliodonium salt. The organic polymer described therein is a novolak having an average molecular weight of 200 to 20,000. The disadvantage of these resist compositions is that the novolaks have relatively low glass transition temperatures, that they are not sufficiently transparent in the region around 250 nm, and that the photoinitiators on irradiation do not form any photoproducts, aside from the acids, which bring about an increase in the solubility in the alkaline developer.

EP-A-0,146,411 describes photosolubilizable mixtures which consist of an alkali-soluble phenolic resin and a radiation sensitive onium salt. The disadvantage of the compositions described therein is that their transparency is insufficient, their sensitivity is relatively low, and the contrast is too weak.

It is an object of the present invention to provide highly reactive radiation sensitive systems for the production of relief structures which are developable with aqueous alkaline solutions, the compounds added to inhibit the solubility of the polymeric binder increasing on irradiation the solubility thereof in alkaline developers and making possible the production of light sensitive layers of high transparency to shortwave UV.

We have found, surprisingly, that this object is achieved in a highly advantageous manner by the mixtures according to the invention.

The present invention accordingly provides a radiation sensitive mixture containing
(a) a polymeric binder which is insoluble in water but soluble in aqueous alkaline solutions and
(b) an organic compound whose solubility in an aqueous alkaline developer is increased by the action of acid and which contains at least one acid cleavable group and additionally a group which forms a strong acid on irradiation,
wherein the polymeric binder (a) is poly(p-hydroxystyrene), poly(p-hydroxy-α-methylstyrene) or a copolymer of p-hydroxystyrene and p-hydroxy-α-methylstyrene and which additionally contains
(c) a nonphotosensitive organic compound which contains at least one acid cleavable bond and the solubility of which in an aqueous alkaline developer is increased by the action of acid, or
(d) a nonphotosensitive organic compound which contains at least one acid cleavable bond and which by the action of acid decomposes in such a way as to be completely removable by treatment at from 60° to 120° C., or a mixture of the nonphotosensitive organic compounds (c) and (d).

Preferred organic compounds (b) are sulfonium salts of the general formula (I)

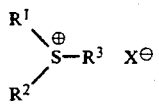

where $R^1$, $R^2$ and $R^3$ are identical to or different from one another and each is singly acyclyl or aryl with or without hetero atoms, or two of $R^1$ to $R^3$ together form a ring, with the proviso that at least one of $R^1$ to $R^3$ contains one or more acid cleavable groups, one of $R^1$ to $R^3$ may be linked to one or more further sulfonium salt residues directly or acid cleavable groups, and $X^\ominus$ is a nonnucleophilic counterion.

Preferred nonphotosensitive organic compounds (c) which contain at least one acid cleavable bond and the solubility of which in an aqueous alkaline developer is increased by the action of acid are the tert-butyl carbonate or silyl ether of a hydroxyphenyl compound of the general formula (II)

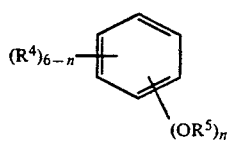

where $R^4$ is hydrogen, $C_1$-$C_6$-alkyl, $C_1$-$C_6$-alkoxy, halogen, phenyl or fused-on aryl, $R^5$ is tert-butoxycarbonyl or trialkylsilyl, and n is from 1 to 3.

Preferred nonphotosensitive organic compounds (d) which contain at least one acid cleavable bond and which by the action of acid decompose in such a way as to be completely removable by treatment at from 60° to 120° C. are derivatives of pyrocarbonic acid or of orthocarbonic acid, in particular dialkyl pyrocarbonates and tetraalkyl orthocarbonates.

The present invention also provides a process for producing relief patterns and relief images using a radiation sensitive mixture according to the invention which following irradiation is preferably heated to from 60° to 120° C.

The radiation sensitive mixtures according to the invention make it possible to produce light sensitive layers of high transparency to shortwave UV and they give very uniform developability.

Furthermore, the sensitivity of the systems due to the catalytic effect of the photochemically produced acids is very high (>100 m/cm², depending on the level of compounds b)), giving very high contrasts. These radiation sensitive mixtures are therefore very highly suitable for use in deep UV lithography.

There now follow specifics concerning the buildup components of the radiation sensitive mixture according to the invention.

(a) The polymeric binder (a) consists essentially of poly(p-hydroxystyrene), poly(p-hydroxy-α-methylstyrene) or copolymers of p-hydroxystyrene and p-hydroxy-α-methylstyrene and has in general an average molecular weight $\overline{M}_w$ of from 2000 to 100,000, preferably from 20,000 to 70,000.

The polymeric binder (a) is in general present in the mixture according to the invention in an amount of from 55 to 90, preferably from 70 to 85, % by weight, based on the total amount of components (a) to (d).

(b) The organic compound (b) whose solubility in an aqueous alkaline developer is increased by the action of acid and which contains at least one acid cleavable group which forms a strong acid on irradiation preferably contains at least one sulfonium salt group and at least one t-butyl carbonate group or at least one silyl ether group. However, it is also possible to use other compounds which form a strong acid on irradiation and contain an acid cleavable bond in the same molecule.

Particularly preferred organic compounds (b) of the type defined are those of the general formula (I)

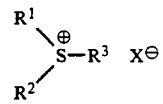

where $R^1$, $R^2$ and $R^3$ are identical to or different from one another and each is singly acyclyl or aryl with or without hetero atoms, or two of $R^1$ to $R^3$ together form a ring, with the proviso that at least one of $R^1$ to $R^3$ contains one or more acid cleavable groups, preferably t-butyl carbonates of phenols or silyl ethers of phenols, one of $R^1$ to $R^3$ may be linked to one or more further sulfonium salt residues directly or via acid cleavable groups, and $X^\ominus$ is a nonnucleophilic counterion.

It is also possible for two or more sulfonium units in the molecule to be linked together via $R^1$ to $R^3$. The organic compounds (b) are in general used in amounts of from 5 to 15, preferably from 5 to 10, % by weight, based on the total amount of radiation sensitive mixture.

Preferred sulfonium salts of the general formula (I)

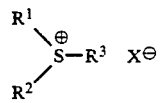

are those where $R^1$ and $R^2$ are each methyl and $R^3$ is substituted phenyl with acid cleavable groups, such as

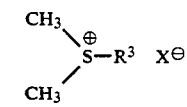

where $R^3$ is for example 4-t-butoxycarbonyloxyphenyl, 4-t-butoxycarbonyloxy-3,5-dimethylphenyl, 4-t-butoxycarbonyloxy-3-methylphenyl, 4-t-butoxycarbonyloxy-2-methylphenyl, 4-t-butoxycarbonyloxy-3,5-dimethoxyphenyl, 4-t-butoxycarbonyloxy-3,5-diphenylphenyl, 1-t-butoxycarbonyloxynaphthyl, 4-trimethylsilyloxyphenyl or 4-trimethylsilyloxynaphthyl, or else those where two of $R^1$ to $R^3$ together form a ring, in particular a five- or six-membered ring, and for example $R^1$ and $R^2$ are for example bridged to form tetramethylene groups and $R^3$ is as defined above:

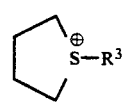

or compounds where $R^1$ is methyl, $R^2$ is phenyl or tolyl and $R^3$ is substituted phenyl with acid cleavable groups, such as

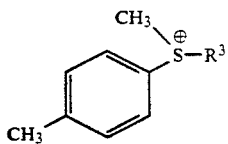

where $R^3$ is 4-t-butoxycarbonyloxyphenyl, 2,4-di-t-butoxycarbonyloxyphenyl, 4-t-butoxycarbonyloxy-2-methoxyphenyl or 4-trimethylsilylphenyl, or where $R^1$ is phenyl or $C_1$–$C_{12}$-substituted phenyl or halogen-substituted phenyl and $R^2$ and $R^3$ are each substituted phenyl with acid cleavable groups, for example

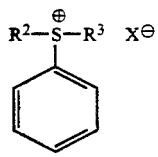

where $R^2$ and $R^3$ are each for example 4-t-butoxycarbonyloxyphenyl, 4-trimethylsilyloxyphenyl, 4-t-butyldimethylsilyloxyphenyl or 4-t-butoxycarbonyloxy-3,5-dimethylsilyloxyphenyl phenyl, or $R^1$, $R^2$ and $R^3$ are identical to one another, i.e. sulfonium salts (b) containing three of these radicals with acid cleavable groups.

Other possibilities include compounds of the general formula (I) where one of $R^1$ to $R^3$ is linked to one or more further sulfonium salt residues directly or via acid cleavable groups which thus likewise contain a plurality of sulfonium groups in the molecule, for example

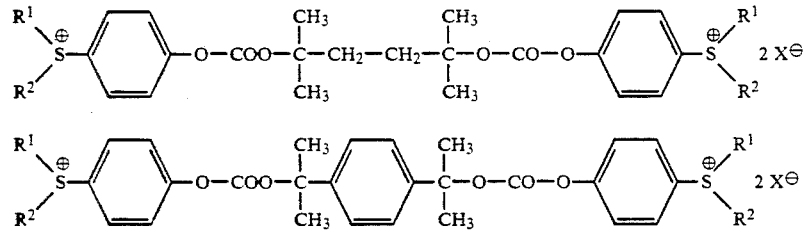

Preferred counterions are complex metal halides, such as tetrafluoroborate, hexafluoroantimonate, hexafluoroarsenate and hexafluorophosphate. Yet the invention is not restricted to these specific counterions, nor to the recited compounds having acid cleavable groups; on the contrary, it is possible to use any compound which forms a strong acid on irradiation and contains an acid cleavable bond in the same molecule.

The organic compounds (b) can be prepared by the known methods of organic chemistry for the synthesis of esters, ethers and carbonates by starting from sulfonium salts having phenolic groups and derivatizing them appropriately. They can be reacted with potassium t-butoxide and afterwards the acid cleavable group can be introduced with di-t-butyl dicarbonate, or alternatively the phenolic sulfonium salt can be reacted with an activated carbonyl compound, for example t-butyloxycarbonyl-N-imidazole. This reaction is especially suitable for hydroxyphenylsulfonium salts which already contain a nonnucleophilic anion, for example hexafluoroantimonate. Such compounds can be prepared for example by the method given in J. Polym. Sci., Chem. Ed., 18 (1980), 1021. The compounds so prepared can be dissolved for example in dry tetrahydrofuran and potassium t-butoxide in dry tetrahydrofuran can be added, followed dropwise by a solution of di-t-butyl dicarbonate in tetrahydrofuran. Working up and recrystallization then gives the pure sulfonium salts having acid labile groups.

Preferred examples of organic compounds (b) are dimethyl-4-t-butoxycarbonyloxyphenylsulfonium salts with hexafluoroarsenate, hexafluoroantimonate, hexafluorophosphate and/or hexafluoroborate as counterion, phenylbis(4-t-butoxycarbonyloxyphenyl)sulfonium salts with the counterions mentioned, tris(4-t-butoxycarbonyoxyphenyl)sulfonium salts with the counterions mentioned and 1-naphthyl-4-trimethylsilyloxytetramethylenesulfonium salts with the counterions mentioned.

(c) A nonphotosensitive organic compound (c) which contains at least one acid cleavable bond and the solubility of which in an aqueous alkaline developer is increased by the action of acid is preferably a tert.-butyl carbonate or silyl ether of a hydroxyphenyl compound of the general formula (II)

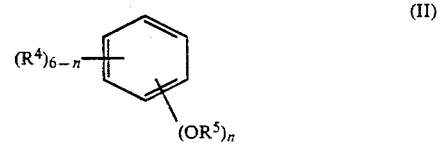

where $R^4$ is hydrogen, $C_1$–$C_6$-alkyl, preferably $C_1$–$C_6$-alkoxy, preferably H, or halogen, phenyl or fused-on aryl, for example naphthyl, $R^5$ is tert-butoxycarbonyl or trialkylsilyl of from 1 to 6 carbon atoms in the alkyls, preferably methyls, and n is from 1 to 3, for example 4-butyloxycarbonyloxy-1-t-butylbenzene, 4-t-butoxycarbonyloxy-3,5-dimethoxybenzene, trimethylsilyloxy-4-chlorobenzene, 1,4-bis(t-butoxycarbonyloxy)benzene, 1,3,5-tris(t-butoxycarbonyloxy)benzene, 1,3,5-tris(trimethylsilyloxy)benzene or 1-t-butoxycarbonyloxy-5,6,7,8-tetrahydronaphthalene.

However, the invention is not restricted to this specific choice of the compounds (c) mentioned above; on the contrary, there are a number of possible further phenolic t-butyl carbonates and silyl ethers if the specific condition of high transparency in the shortwave uv region need not be met, for example 1,4,9,10-tetra(t-butoxycarbonyloxy)anthracene, 1,2,5,8-tetra(t-butoxycarbonyloxy)anthraquinone, 2,2′4,4,′-tetra(t-butoxycarbonyloxy)benzophenone and 1,8,9-tris(trimethylsilyloxy)anthracene.

The compounds (c) can be prepared by the known methods of organic chemistry for the synthesis of esters, ethers and carbonates by starting from aromatics having phenolic groups and derivatizing them appropriately.

An example of the synthesis of a compound (c) is the preparation of 1,4-di(t-butoxycarbonyloxy)benzene:

A 1 l three-necks flask is charged with 200 ml of dry tetrahydrofuran (THF), and a slow stream of nitrogen is passed through. 22.0 g of hydroquinone are then added, followed, once everything has dissolved, by 44.8 g of potassium t-butoxide. After about 10 minutes' reaction 90.5 g of di-t-butyl dicarbonate in 100 ml of THF are slowly added dropwise. The mixture is afterwards stirred for an hour and then introduced into 2 l of icewater. The mixture is extracted with 2l of ethyl acetate a little at a time. The organic phase is washed with 6l of water a little at a time and dried over magnesium sulfate. The solvent is evaporated off, and the product is recrystallized from ethanol. Yield: 11.2 g.

Elemental analysis found: C 61.8 H 7.2 0 30.7 calc.: C 61.9 H 7.2 0 30.9.

Melting point: 142° C. (DSC).

1-H NMR s 1.6 ppm (18 H), s 7.2 ppm (4 H).

The method can be used to prepare all other phenolic compounds having t-butyl carbonate groups.

The compounds having trialkylsilyl groups can be prepared by reacting the corresponding phenolic compounds with hexamethyldisilazane or other silylating reagents. Example of the synthesis of tris-1,3,5-(trimethylsilyloxy)benzene:

A 100 ml round-bottomed flask is charged with 5.0 g of 1,3,5-trihydroxybenzene and 25.0 g of hexamethyldisilazane, and the contents are maintained at 100° C. for 6 hours. Excess hexamethyldisilazane is then removed under reduced pressure, and the liquid residue is subjected to fractional distillation. The IR spectrum has no OH bands but has strong aliphatic bands at 2900 cm$^{-1}$ and Si-methyl bands at 1260 cm$^{-1}$ and 850 cm$^{-1}$.

Elemental analysis found: C 52.4 H 8.9 Si 21.8 calc.: C 52.6 H 8.8 Si 24.6.

(d) Nonphotosensitive organic compounds which contain at least one acid cleavable bond and which by the action of acid decompose in such a way as to be completely removable by treatment at from 60° to 120° C. are preferably derivatives of pyrocarbonic acid or of orthocarbonic acid, for example dialkyl pyrocarbonates of from 1 to 8, preferably from 1 to 5, carbon atoms in the alkyls, such as dimethyl pyrocarbonate, diethyl pyrocarbonate, di-tert-butyl pyrocarbonate or di-tertamyl pyrocarbonate, and also tetraalkyl orthocarbonates of from 1 to 6, preferably from 1 to 4, carbon atoms in the alkyls, preferably tetraethyl orthocarbonate and/or tetramethyl orthocarbonate.

The compounds (d) are commercial products (for example from Aldrich, Fluka or Merck).

The compounds (c) and/or (d) are in general present in the radiation sensitive mixture according to the invention in amounts of from 5 to 30, preferably from 10 to 20, % by weight, based on the total amount of radiation sensitive mixture.

The radiation sensitive mixtures according to the invention are sensitive to X-rays, electron beams and UV radiation. If desired, sensitizers may be added in small amounts, for example pyrene and perylene, in order to sensitize the compounds in from the longer wave UV to the visible wavelength region. Irradiation in specific wavelength regions, for example in the shortwave UV region (<300 nm), requires a high transparency of the layers at the particular irradiation wavelength. Conventional exposure units based on mercury lamps make use of the 254 nm line, and excimer lasers emit at 248 nm (KrF). Radiation sensitive recording materials should therefore have very low optical densities in this region.

To the absorption of polymeric binder (a) it is necessary to add the absorption of compounds (b). For instance, compounds such as phenylbis(t-butoxycarbonyloxyphenyl)sulfonium hexafluoroarsenate and tris(t-butoxycarbonyloxyphenyl)sulfonium hexafluoroarsenate have extinction coefficients > 5000.

To obtain any solubility inhibition with these components, however, it is necessary to add distinctly more than 10% by weight of these compounds to the binder, so that optical densities of the order of 1 per $\mu$m of layer thickness or higher are the result.

Surprisingly, however, the proportion of compounds (b) can be reduced if nonphotosensitive components of type (c) or (d) are used as additional solubility inhibitors. The compounds of type (c) can be altered by the action of acid formed by the photoreaction of compounds (b) in their solubility characteristics in such a way that the hydrophobic starting compounds become alkali soluble products. In the exposed areas, the action of radiation leads to the formation of alkali soluble products not only from the photosensitive compounds (b) but also from compounds (c).

By adding the compounds (c) it is possible to improve the optical density (OD) in the wavelength region around 250 nm to a significant degree:

Binder Poly(p-hydroxystyrene) OD (248 nm) 0.22/$\mu$m

Poly(p-hydroxystyrene)+20% by weight of tris(t-butoxycarbonyloxyphenyl)sulfonium hexafluoroarsenate OD (248 nm) 0.95/$\mu$m Poly(p-hydroxystyrene)+5% by weight of tris(t-butoxycarbonyloxyphenyl)sulfonium hexafluoroarsenate+5% by weight of 1,3,5-tri(t-butoxycarbonyloxy)benzene OD (248 nm) 0.50/$\mu$m In the novel process for producing relief patterns and relief images, a radiation sensitive recording layer consisting essentially of the novel radiation sensitive mixture applied, conveniently from a solution in an inert solvent, for example methylpropylene glycol acetate, methylcellosolve acetate or ethylcellosolve acetate, to a suitable substrate, for example a silicon wafer, in a conventional manner, for example by spin coating, in a layer thickness (measured dry) of from 0.2 to 4 $\mu$m and dried, is subjected to imagewise exposure at such a rate, and then baked at from 60° to 120° C. for from 5 seconds to 5 minutes, that the solubility of the exposed areas in aqueous alkaline solvents, for example alkaline developers at pH 10-14, containing alkali metal hydroxides, alkali metal silicates or amines, such as tetramethylammonium hydroxide, increases and these exposed areas can be selectively removed with the alkaline developer.

The mixtures show high sensitivity and contrasts. They give relief structures of good quality.

In the Examples, parts and percentages are by weight, unless otherwise stated.

EXAMPLE 1

A photoresist solution is prepared from 5 parts of tris(4-t-butoxycarbonyloxyphenyl)sulfonium hexafluoroarsenate, 15 parts of 1,3,5-tri(t-butoxycarbonyloxy)benzene, 80 parts of poly(p-hydroxystyrene) and 300 parts of methylpropylene glycol acetate. The solution is subsequently filtered through a filter 0.2 $\mu$m in pore diameter.

This resist solution is spincoated onto a silicon wafer bearing an SiO$_2$ film in a layer thickness of about 1.0 $\mu$m. The wafer is dried at 90° C. for one minute, and then brought into contact with an image structured test mask and irradiated for 3 seconds with excimer laser light of the wavelength 248 nm. It is then heated at 80° C for 60 seconds and developed with a pH 13.00 developer for 30 seconds. The exposed areas have been completely removed, while no depletion is measured in the unexposed areas. The resist patterns show vertical sidewalls.

COMPARATIVE EXAMPLE (without compounds (c) or (d))

A photoresist solution is prepared from 20 parts of tris(4-t-butoxycarbonyloxyphenyl)sulfoniumhexafluoroarsenate, 80 parts of poly(p-hydroxystyrene) and 300 parts of methylpropylene glycol acetate. Example 1 is repeated, except that 8 seconds' irradiation is necessary to ensure complete removal of the exposed areas under the same conditions. The resist profiles have inclined edges.

EXAMPLE 2

A photoresist solution is prepared from 0.25 part of phenylbis(4-t-butoxycarbonyloxyphenyl)sulfonium hexafluoroarsenate, 1 part of di-t-butyl dicarbonate, 1 part of poly(p-hydroxystyrene) and 5.75 parts of diethylene glycol dimethyl ether. The solution is filtered through a filter 0.2 μm in pore diameter.

A layer of about 5 μm thickness is spincoated onto a sodium chloride disk. After the NaCl disk has been heated at 80° C. for 60 seconds, the IR spectrum shows two carbonyl bands of the dicarbonate at 1760 cm$^{-1}$ and 1800 cm$^{-1}$. Following further heating of the sodium chloride disk at 90° C. for 60 seconds, the band decreases by 40%. A layer of the resist solution on a wafer if heated under the same conditions loses only about 5% of its layer thickness in the course of 30 seconds' development with a pH 13.0 developer.

If, however, an approximately 5 μm thick layer is spincoated onto an NaCl disk, heated at 80° C. for 60 seconds, exposed for 20 seconds to excimer laser light of the wavelength 248 nm and then heated at 90° C. for 60 seconds, the carbonyl bands at 1800 cm$^{-1}$ and 1760 cm$^{-1}$ have completely disappeared. A similarly treated layer on a silicon wafer disappears completely in the pH 13.0 developer over 20 seconds.

We claim:

1. A radiation sensitive mixture containing
   (a) a polymeric binder which is insoluble in water but soluble in aqueous alkaline solutions and (b) an organic compound whose solubility in an aqueous alkaline developer is increased by the action of acid and which contains at least one acid cleavable group and additionally at least one sulfonium group which forms a strong acid on irradiation,
   wherein the polymeric binder (a) is poly(p-hydroxystyrene), poly(p-hydroxy-α-methylstyrene) or a copolymer of p-hydroxystyrene and p-hydroxy-α-methylstyrene and which additionally contains
   (c) a nonphotosensitive organic compound which contains at least one acid cleavable bond and the solubility of which in an aqueous alkaline developer is increased by the action of acid, or
   (d) a nonphotosensitive organic compound which contains at least one acid cleavable bond and which by the action of acid decomposes in such a way as to be completely removable by treatment at from 60° to 120° C., or a mixture of the nonphotosensitive organic compounds (c) and (d).

2. A radiation sensitive mixture as defined in claim 1, wherein the organic compound (b) is a sulfonium salt of the formula (I)

where $R^1$, $R^2$ and $R^3$ are identical to or different from one another and each is singly acyclyl or aryl with or without hetero atoms, or two of $R^1$ to $R^3$ together form a ring, with the proviso that at least one of $R^1$ to $R^3$ contains one or more acid cleavable groups, one of $R^1$ to $R^3$ may be linked to one or more further sulfonium salt residues directly or via acid cleavable groups, and $X^\ominus$ is a nonnucleophilic counterion.

3. A radiation sensitive mixture as defined in claim 1, wherein the nonphotosensitive organic compound (c) which contains at least one acid cleavable bond and the solubility of which in an aqueous alkaline developer is increased by the action of acid is at least one tert.-butyl carbonate or silyl ether of a hydroxyphenyl compound of the formula (II)

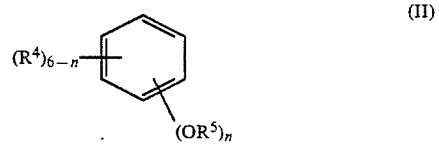

where $R^4$ is hydrogen, $C_1$-$C_6$-alkyl, $C_1$-$C_6$-alkoxy, halogen, phenyl or fused-on aryl, $R^5$ is tert.-butoxycarbonyl or trialkylsilyl, and n is from 1 to 3.

4. A radiation sensitive mixture as defined in claim 2, wherein the nonphotosensitive organic compound (c) which contains at least one acid cleavable bond and the solubility of which in an aqueous alkaline developer is increased by the action of acid is at least one tert.-butyl carbonate or silyl ether of a hydroxyphenyl compound of the formula (II)

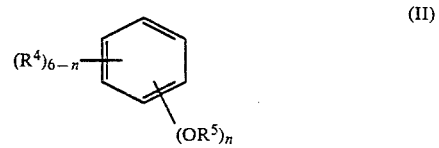

where $R^4$ is hydrogen, $C_1$-$C_6$-alkyl, $C_1$-$C_6$-alkoxy, halogen, phenyl or fused-on aryl, $R^5$ is tert.-butoxycarbonyl or trialkylsilyl, and n is from 1 to 3.

5. A radiation sensitive mixture as defined in claim 1, wherein the nonphotosensitive organic compound (d) which contains at least one acid cleavable bond and which by the action of acid decomposes in such a way as to be completely removable by treatment at from 60° to 120° C. is at least one derivative of pyrocarbonic acid or of orthocarbonic acid.

6. A radiation sensitive mixture as defined in claim 2, wherein the nonphotosensitive organic compound (d) which contains at least one acid cleavable bond and which by the action of acid decomposes in such a way as to be completely removable by treatment at from 60° to 120° C. is at least one derivative of pyrocarbonic acid or of orthocarbonic acid.

7. A radiation sensitive mixture as defined in claim 5, wherein the nonphotosensitive organic compound (d) is a dialkyl pyrocarbonate or a tetraalkyl orthocarbonate.

8. A radiation sensitive mixture as defined in claim 6, wherein the nonphotosensitive organic compound (d) is a dialkyl pyrocarbonate or a tetraalkyl orthocarbonate.

* * * * *

UNITED STATES PATENT AND TRADEMARK OFFICE
CERTIFICATE OF CORRECTION

PATENT NO. : 5,069,998

DATED : December 3, 1991

INVENTOR(S) : Reinhold SCHWALM et al.

It is certified that error appears in the above-identified patent and that said Letters Patent is hereby corrected as shown below:

Claim 1, Column 9, Line 51

"sulfonium group" should read --sulfonium salt group--.

Signed and Sealed this

Thirteenth Day of April, 1993

Attest:

STEPHEN G. KUNIN

Attesting Officer

Acting Commissioner of Patents and Trademarks